(12) United States Patent
Reitsma

(10) Patent No.: US 10,381,992 B1
(45) Date of Patent: Aug. 13, 2019

(54) AMPLITUDE CONTROL WITH SIGNAL SWAPPING

(71) Applicant: TEXAS INSTRUMENTS INCORPORATED, Dallas, TX (US)

(72) Inventor: George Reitsma, Redwood City, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/899,598

(22) Filed: Feb. 20, 2018

(51) Int. Cl.
*H03F 3/45* (2006.01)
*H03D 7/16* (2006.01)
*H03D 7/14* (2006.01)
*H03L 7/197* (2006.01)
*H03L 7/087* (2006.01)
*H03L 7/089* (2006.01)
*H03F 1/08* (2006.01)

(52) U.S. Cl.
CPC ....... *H03F 3/45475* (2013.01); *H03D 7/1441* (2013.01); *H03D 7/1458* (2013.01); *H03D 7/165* (2013.01); *H03F 1/086* (2013.01); *H03L 7/087* (2013.01); *H03L 7/0898* (2013.01); *H03L 7/1976* (2013.01)

(58) Field of Classification Search
CPC ..................... H03F 1/02; H03F 3/45
USPC ............................................... 330/9; 327/124
See application file for complete search history.

(56) References Cited

U.S. PATENT DOCUMENTS

| | | | |
|---|---|---|---|
| 2007/0013438 A1* | 1/2007 | Chuang | H03F 3/45 330/9 |
| 2017/0070216 A1* | 3/2017 | Lin | H03F 3/26 |
| 2017/0292981 A1 | 10/2017 | Reitsma et al. | |

* cited by examiner

*Primary Examiner* — Steven J Mottola
(74) *Attorney, Agent, or Firm* — John R. Pessetto; Charles A. Brill; Frank D. Cimino

(57) ABSTRACT

A circuit includes a first signal swapper including a first terminal coupled to a first current source, a second terminal coupled to a second current source, a third terminal coupled to a first current terminal of a first transistor, and a fourth terminal coupled to a third current terminal of a second transistor. The first signal swapper couples the first and second terminals to the third and fourth terminals responsive to a first control signal. First and second switches couple to a gate of the first transistor. The first switch receives the input oscillation signal and the second switch receives a first reference voltage. Third and fourth switches couple to a gate of the second transistor. The third switch receives the input oscillation signal and the fourth switch receives the first reference voltage. A second signal swapper couples to the first signal swapper and to the first and second transistors.

17 Claims, 4 Drawing Sheets

AMPLITUDE CONTROL WITH SIGNAL SWAPPING

BACKGROUND

Some systems include the use of a harmonic oscillator. For example, in inductive sensing applications, an "LC tank" is driven to produce an oscillation signal whose frequency vanes with distance to a nearby conductive object. The frequency of the oscillation signal is a function of the distance to the object. Such systems are useful as distance measurement sensors.

Due to manufacturing tolerances, stress (pressure) and temperature gradients, mismatches between circuit components (which otherwise should have identical characteristics) may introduce error in the amplitude control of the oscillation signal. Static mismatches, which do not change with time, can be corrected with various techniques such as calibration, differential measurements, etc. However, such techniques are not particularly useful to correct for mismatches in component characteristics that vary with time, such as temperature gradients and flicker noise.

SUMMARY

In some examples, a circuit includes first and second transistors. A first signal swapper includes a first terminal coupled to a first current source terminal, a second terminal coupled to a second current source terminal, a third terminal coupled to a first current terminal of the first transistor, and a fourth terminal coupled to a third current terminal of the second transistor. The first signal swapper selectively couples the first and second terminals to the third and fourth terminals responsive to a first control signal derived from an input oscillation signal. First and second switches couple to the first control input of the first transistor, and the first switch receives the input oscillation signal and the second switch is coupled to receive a first reference voltage. Third and fourth switches couple to the second control input of the second transistor. The third switch receives the input oscillation signal and the fourth switch receives the first reference voltage. A second signal swapper is coupled to the first signal swapper, to the first current terminal of the first transistor and to the third current terminal of the second transistor.

In another example, a circuit includes a first rectifier coupled to rectify an input oscillation signal as a first rectified output signal, a second rectifier coupled to rectify the input oscillation signal as a second rectified output signal, and a first analog multiplexer having a first output and configured to select, responsive to a first control signal derived from an input oscillation signal, as the first output the first rectified output signal or a reference signal. A second analog multiplexer includes a second output and is configured to select, responsive to the first control signal, as the second output the other one of the second rectified output signal or the reference signal not selected by first analog multiplexer. A first selectable gain amplifier couples to the first analog multiplexer and is configured, responsive to the first control signal, to select between a first gain or a second gain for application to the first output from the first analog multiplexer. A second selectable gain amplifier is coupled to the second analog multiplexer and configured, responsive to the first control signal, to select between the other of the first gain or the second gain not selected by the first selectable gain amplifier, for application to the second output from the second analog multiplexer. A signal swapper is coupled to the first and second selectable gain amplifiers and includes a first signal swapper output and a second signal swapper output. Wherein the signal swapper is configured to select, responsive to the first control signal, as the first signal swapper output a signal from one of the first and second gain amplifiers and as the second signal swapper output the other signal from the first and second gain amplifiers.

A circuit includes a first transistor including a first control input, a first current terminal, and a second current terminal and a second transistor including a second control input, a third current terminal, and a fourth current terminal. A first signal swapper includes a first terminal to couple to a first current source terminal, a second terminal to couple to a second current source terminal, a third terminal to couple to the first current terminal of the first transistor, and a fourth terminal to couple to the third current terminal of the second transistor. The first signal swapper selectively electrically couples the first and second terminals to the third and fourth terminals responsive to a first control signal derived from an input oscillation signal. A first rectifier and a first analog multiplexer rectify the input oscillation signal to produce a first rectified signal and select between the first rectified signal and a first reference voltage. A second rectifier and a second analog multiplexer rectify the input oscillation signal to produce a second rectified signal and select between the second rectified signal and the first reference voltage. A second signal swapper is coupled to the first transistor, the second transistor, and the first signal swapper. The second signal swapper selectively couples the first transistor to one of the first and second current source terminals and to couple the second transistor to the other of the first and second current source terminals.

BRIEF DESCRIPTION OF THE DRAWINGS

For a detailed description of various examples, reference will now be made to the accompanying drawings in which.

DETAILED DESCRIPTION

In integrated circuits, flicker noise can be a significant source of time-varying mismatch among component characteristics. Flicker noise may manifest itself as a varying conductance in resistors and transistors, as well as time-varying threshold mismatches in transistors. In the disclosed examples, errors due to static as well as time-varying component mismatches are eliminated using "swapping" in which each component pair that needs to match are swapped during each cycle of a periodic signal. As a result, the sign of the mismatch (positive versus negative) is inverted every half of the cycle and thus the time average of the mismatch is approximately zero.

Figure 1:
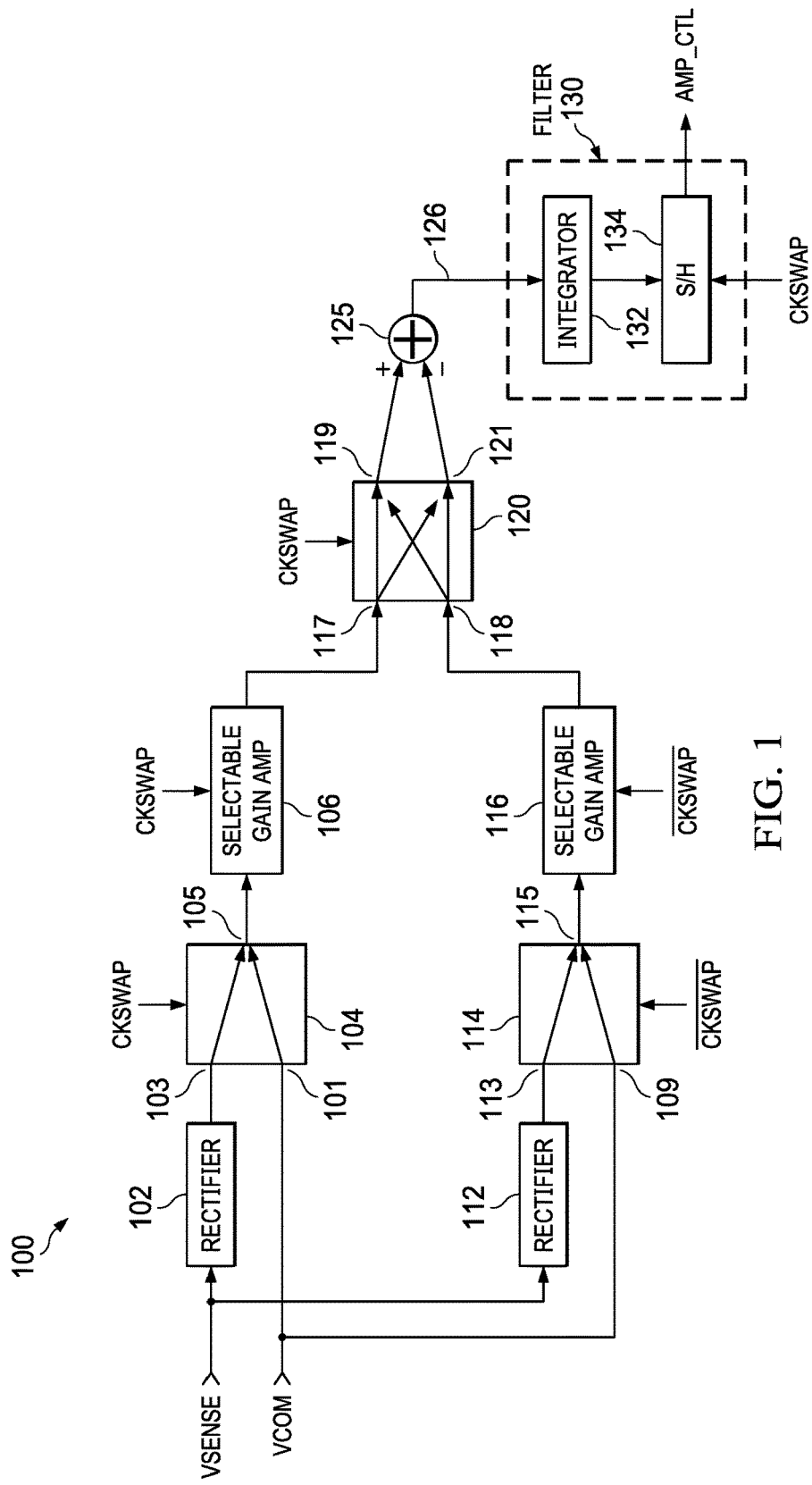
FIG. 1 illustrates a swapping-based amplitude control circuit in accordance with an example.
Figure 6:
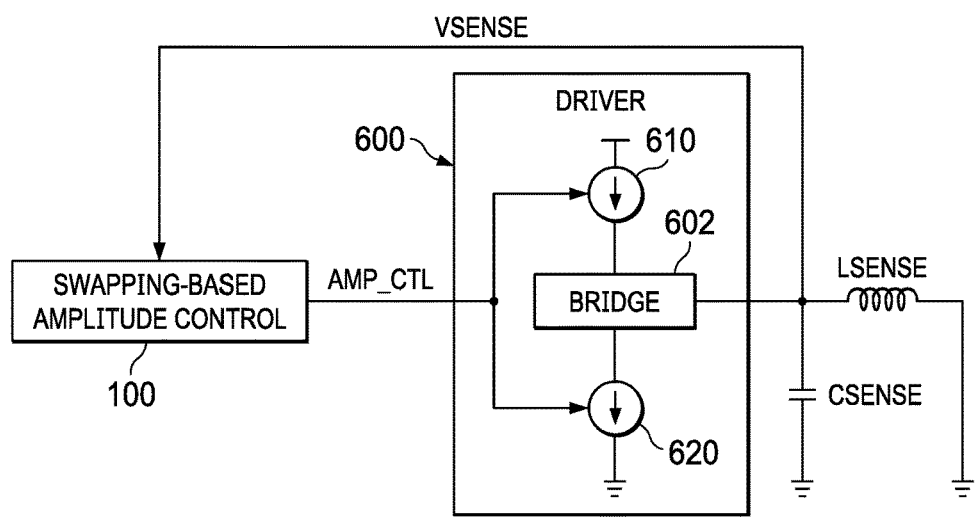
FIG. 6 illustrates the use of the swapping-based amplitude control circuit in a oscillation-based sensor system.

FIG. 1 shows an example of a swapping-based amplitude control circuit 100. The swapping-based amplitude control circuit 100 of FIG. 1 generates an output amplitude control signal (AMP_CTL) responsive to the magnitude of an input oscillation signal (VSENSE). In some examples, if the magnitude of VSENSE increases, the magnitude of AMP_CTL decreases and vice versa (a decrease in the magnitude of VSENSE causes an increase in AMP_CTL). AMP_CTL can be used to control the magnitude of the input oscillation signal. One use-case of controlling the magnitude of VSENSE is shown in FIG. 6 (discussed below) for controlling the magnitude of an oscillation signal (VSENSE) for an LC tank circuit used as a distance assessment device.

The swapping-based amplitude control circuit 100 of FIG. 1 includes rectifiers 102 and 112, analog multiplexers 104 and 114, selectable gain amplifiers 106 and 116, a signal swapper 120, a summer 125, and a filter 130. The VSENSE input oscillation signal is provided to, and rectified by, both rectifiers 102 and 112. The rectifiers 102 and 112 may be half bridge or full bridge rectifiers. In response to a control signal labeled as CKSWAP (explained below), analog multiplexer 104 selects one of its inputs 101 and 103 to provide a signal to output 105. Input 103 receives the VSENSE rectified signal from rectifier 102 and input 101 receives a reference signal designated as VCOM. VCOM is a constant voltage that represents the voltage level about which VSENSE oscillates. The selected input signal of analog multiplexer 104 is provided to the selectable gain amplifier 106. The selectable gain amplifier 106 applies a selectable gain to the output 105 from the analog multiplexer 104. In some cases, the gain implemented by the selectable gain amplifier 106 is one of two different gain factors (e.g., G1 and G2). The selection of the gain factor is based on CKSWAP. If CKSWAP is a logic high, one gain factor (e.g., G1) is selected for application to the output of analog multiplexer 104, and if CKSWAP is low, the other gain factor (e.g., G2) is selected for application to the analog multiplexer's output.

Similarly, the rectified output from rectifier 112 is provided to an input 113 of analog multiplexer 114. The other input 109 of analog multiplexer 114 receives VCOM. The analog multiplexer 114 is configured to select as its output 115 the signal on input 113 or input 109 opposite to that selected by analog multiplexer 104. That is, if analog multiplexer 104 selects the rectified output from rectifier 102 as its output 105, analog multiplexer 114 selects VCOM as its output 115, and if analog multiplexer 104 selects VCOM as its output 105, analog multiplexer 114 selects the rectified output from rectifier 112 as its output 115. The opposing selection decisions made by the analog multiplexer 104 and 114 are represented by CKSWAP provided to analog multiplexer 104 and CKSWAP (logical inverse of CKSWAP) provided to analog multiplexer 114.

The selected input 113, 109 from analog multiplexer 114 is provided to the selectable gain amplifier 116. As for selectable gain amplifier 106, the selectable gain amplifier 116 applies a selectable gain to the output from its respective analog multiplexer 114. As described above, the gain implemented by the selectable gain amplifier 116 is one of two different gain factors (e.g., G1 and G2). The gain factor selected for implementation in the selectable gain amplifier 116 is the other gain factor not selected by selectable gain amplifier 106. That is, if CKSWAP causes selectable gain amplifier 106 to implement gain factor G1, then selectable gain amplifier 116 is configure to implement gain factor G2, and vice versa.

Referring still to FIG. 1, the signal swapper 102 includes terminals 117, 118, 119, and 121. Terminal 117 is coupled to the output of the selectable gain amplifier 106 and terminal 118 is coupled to the output of the selectable gain amplifier 116. Signal swapper 120 implements multiple switches (discuss below) that, responsive to CKSWAP, cause terminals 117 and 118 to be selectively coupled to either terminals 119 or 121. In one logic state, CKSWAP causes terminal 117 to be coupled to terminal 119 and terminal 118 to be coupled to terminal 121. In the other logic state, CKSWAP causes terminal 117 to be coupled to terminal 121 and terminal 118 to be coupled to terminal 119.

The output signals from terminals 119 and 121 from the signal swapper 102 are subtracted by summer 125 and the output difference signal 126 is provided to the filter 130. The filter 130 includes an integrator 132 that integrates the difference signal 126 over time. The integrated output signal 133 is then provided to a sample-and-hold circuit 134. The state of the sample-and-hold circuit's input is sampled and held on its output as AMP_CTL. The CKSWAP signal is used to clock the sample-and-hold circuit to produce AMP_CTL. In some examples, the output of the sample-and-hold circuit 134 is updated once every other cycle of VSENSE. For example, the output of the sample-and-hold 134 is updated either when the CKSWAP transitions from low to high (rising edge) or, in other implementations, when CKSWAP transitions from high to low (falling edge).

Figure 2:
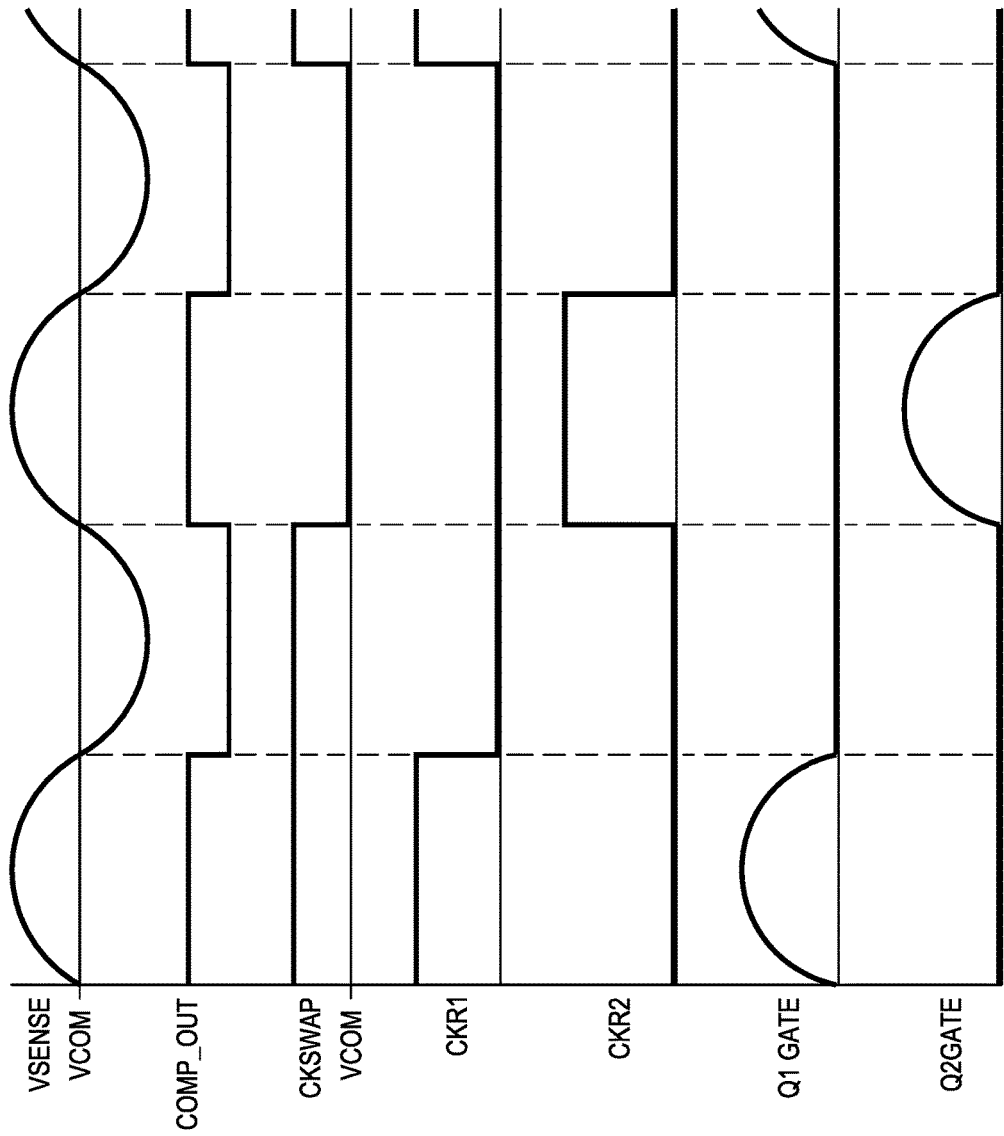
FIG. 2 shows a timing diagram of various signals in accordance with an example.

FIG. 2 shows a timing diagram illustrating several cycles of VSENSE. CKSWAP is derived from VSENSE using any of various circuits as will be explained below. CKSWAP is a logic high for every other cycle of VSENSE (and thus logic low for the remaining cycles). Referring back to FIG. 1, because CKSWAP is asserted high for every other cycle of VSENSE, rectified VSENSE is selected by analog multiplexer 104 and VCOM is selected by analog multiplexer 114 for every other cycle of VSENSE, and VCOM is selected by analog multiplexer 104 and rectified VSENSE is selected by analog multiplexer 114 for the other cycles of VSENSE. That is, in one cycle of VSENSE, rectified VSENSE is provided through analog multiplexer 104 to the selectable gain amplifier 106 and VCOM is provided through analog multiplexer 114 to the selectable gain amplifier 116, whereas in the next cycle of VSENSE, VCOM is provided through analog multiplexer 104 to the selectable gain amplifier 106 and rectified VSENSE is provided through analog multiplexer 114 to the selectable gain amplifier 116.

Figure 3:
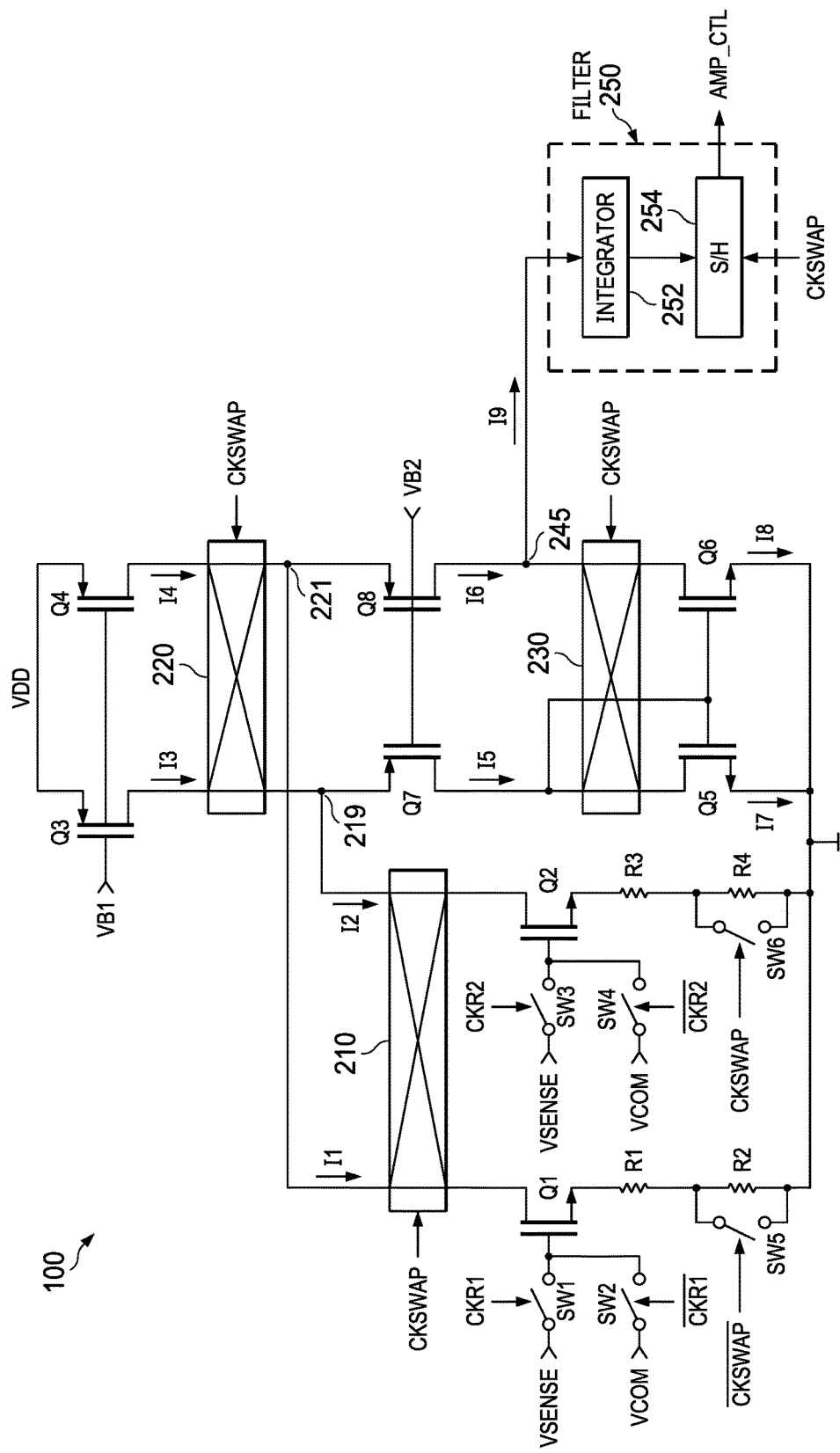
FIG. 3 shows an example implementation of the swapping-based amplitude control circuit of FIG. 1 in accordance with an example.

In one cycle of VSENSE, CKSWAP causes rectified VSENSE to be provided to selectable gain amplifier 106, causes selectable gain amplifier 106 to implement one of its possible gain factors (e.g., G1), and causes the output from the selectable gain amplifier 106 to be provided through signal swapper's output terminal 119 to the plus input (+) of the summer 125. In that same cycle, CKSWAP causes VCOM to be provided to selectable gain amplifier 116, causes selectable gain amplifier 116 to implement the gain factor that is not implemented by selectable gain amplifier 106 (e.g., if selectable gain amplifier 106 implements G1, selectable gain amplifier 116 implements G2), and causes the output from the selectable gain amplifier 116 to be provided through signal swapper's output terminal 121 to the minus input (−) of the summer 125. As a result, AMP_CTL increase if the amplitude of VSENSE decreases and AMP_CTL decreases if the amplitude of VSENSE increases. The swapping functionality of signal swapper 120 helps to reduce flicker noise and other sources of dynamic and static errors that may be associated with components that implement the swapping-based amplitude control circuit 100. The integration of the output difference signal 126 over two cycles of VSENSE, where in one cycle the signal path comprising rectifier 102, analog multiplexer 104 and selectable gain amplifier 106 is configured to process VSENSE, while the signal path comprising analog multiplexer 114 and selectable gain amplifier 116 is configured to process VCOM, and in the other cycle the signal path comprising rectifier 112, analog multiplexer 114, and selectable gain amplifier 116 is configured to process VSENSE, while the signal path comprising of analog multiplexer 104 and selectable gain amplifier 106 is configured to process VCOM, helps to reduce flicker noise and other source of dynamic errors FIG. 3 illustrates an example implementation of the swapping-based amplitude control circuit 100 of FIG. 1. In the example of FIG. 3, the swapping-based amplitude control circuit 100 includes transistors Q1, Q2, Q3, Q4, Q5, Q6, Q7, and Q8, switches SW1, SW2, SW3, SW4, SW5, and SW6, resistors R1, R2, R3, R4, signal swappers 210, 220, and 230, and filter 250. The switches SW1-SW6 are implemented as solid-state (e.g., transistor) switches and are shown with the control signals that causes the switches to be open (on) or closed (off).

Switches SW1 and SW2 are connected together and to the control input of Q1. In the example of FIG. 3, Q1-Q8 are n-type or p-type metal oxide semiconductor field effect transistors (nMOS or pMOS devices), but can be implemented as other types of transistors in other examples (e.g., bipolar junction transistors). Q1, Q2, Q5 and Q6 in this example are nMOS devices and Q3, Q4, Q7, and Q8 are pMOS devices. The control inputs to these transistors are the gates of the MOS devices. In this example, transistors Q3 and Q4 are a matched pair of transistors (e.g., substantially the same threshold voltages, on-resistance (Rds), etc.).

SW1 receives VSENSE and SW2 receives VCOM. SW1 is closed responsive to control signal CKR1 being a logic high and SW2 is closed responsive to CKR1 being a logic low (or vice versa). That is, one, but not both, of SW1 and SW2 is closed at any point in time. Similarly, SW3 and SW4 are connected together and to the gate of Q2. SW3 receives VSENSE and SW4 receives VCOM. SW3 is closed responsive to control signal CKR2 being a logic high and SW4 is closed responsive to CKR2 being a logic low (or vice versa). That is, one, but not both, of SW3 and SW4 are closed at any point in time.

Figure 4:
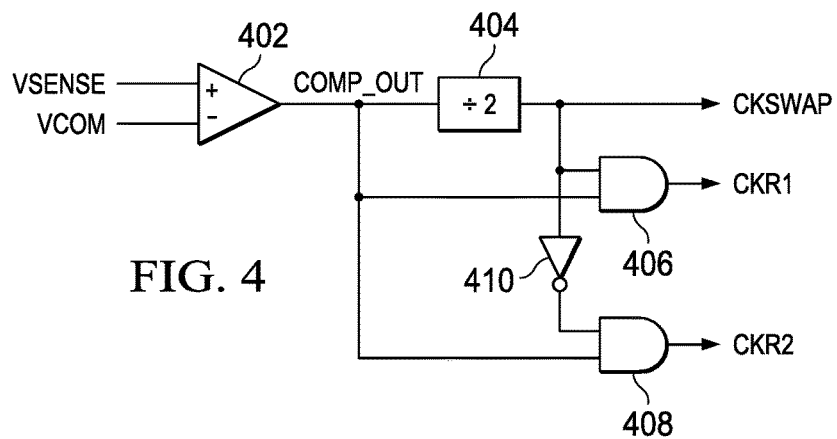
FIG. 4 shows a circuit for generating control signals used in the example implementation of FIG. 3.

Referring to FIG. 2, an example of the switch control signals CKR1 and CKR2 are shown. CKR1 is asserted high when VSENSE is high in every other cycle of VSENSE, and CKR2 is asserted high also when VSENSE but in the other cycles of VSENSE that CKR1 is not asserted high. FIG. 4 shows an example circuit for the generation of CKSWAP, CKR1, and CKR2. The circuit of FIG. 4 includes a comparator 402, a frequency divider 404, AND gates 406 and 408, and an inverter 410. The comparator 402 generates a comparator output signal, COMP_OUT that is logic high when VSENSE is larger than VCOM and logic low when VSENSE is smaller than VCOM. COMP_OUT is thus a square wave (as shown in FIG. 2) with the same frequency as VSENSE and is high when VSENSE is above VCOM and low otherwise. The frequency divider 404 divides the frequency of COMP_OUT by a factor of 2 in this example to generate CKSWAP. As such, as shown in FIG. 2, CKSWAP is high for one complete cycle of VSENSE, low for the next VSENSE cycle, high for the next cycle, and so on. AND gate 406 ANDs COMP_OUT and CKSWAP to generate CKR1. Thus, CKR1 is logic high only when both CKSWAP and COMP_OUT are high, which occurs as shown in FIG. 2 for one-half of every other VSENSE cycle. Inverter 410 inverts CKSWAP and the inverter's output is ANDed with COMP_OUT by AND gate 408 to produce CKR2. CKR2 is logic high only when both COMP_OUT is high and the inverse of CKSWAP is high (i.e., CKSWAP is low). Thus, CKR2 is logic high for one-half of each VSENSE cycle for which CKR1 is low. That is, in one VSENSE cycle, CKR1 is high for half of that cycle and in the next VSENSE cycle CKR2 is high for half of that cycle, then CKR1 is high for half of the next VSENSE cycle, and so on. Circuits, other than that shown in FIG. 4, can be used to generate CKSWAP, CKR1, and CKR2. For example, logic gates other than AND gates 406, 408 can be used. In some cases, finite state machines are used to generate CKSWAP, CKR1, and CKR2.

FIG. 2 also illustrates the voltage level on the gate of Q1 and the gate of Q2. When CKR1 is high thereby connecting VSENSE to the gate of Q1, the gate of Q1 receives VSENSE during the positive phase of every other cycle of VSENSE. When CKR1 is low, the Q1 gate is connected to VCOM. As such, the Q1 gate voltage is either a positive half cycle of VSENSE or VCOM. Switches SW1 and SW2 implement the rectifier 102 and analog multiplexer 104 of FIG. 1. Similarly, when CKR2 is high thereby connecting VSENSE to the gate of Q2, the gate of Q2 receives VSENSE during the positive phase of the odd cycles of VSENSE (those cycles for which CKR1 is not high). When CKR2 is low, the Q2 gate is connected to VCOM. As such, the Q2 gate voltage is either a positive half cycle of VSENSE or VCOM as shown in FIG. 4. Switches SW3 and SW4 implement the rectifier 112 and analog multiplexer 114 of FIG. 1.

Referring back to FIG. 3, the source of Q1 connects to resistor R1, and R1 connects in series to resistor R1. Switch S5 connects in parallel to R2. When closed, SW5 effectively shorts R2 and thus only resistor R1 connects between the source of Q1 and ground. When switch S5 is open, the series combination of R1 and R2 connect between the source of Q1 and ground. The combination of Q1 and resistors R1 and R2 (with R2 being selectable via switch SW5) implements the selectable gain amplifier 106 of FIG. 1. The current through Q1 is designated as I1.

Similarly, the source of Q2 connects to resistor R3, and R3 connects in series to R4. Switch S6 connects in parallel to R4. When closed, SW6 effectively shorts R4 and thus only resistor R3 connects between the source of Q2 and ground. When switch S6 is open, the series combination of R3 and R4 connect between the source of Q2 and ground. The combination of Q2 and resistors R3 and R4 (with R4 being selectable via switch SW6) implements the selectable gain amplifier 116 of FIG. 1. The current through Q2 is designated as I2. In this example, SW5 and SW6 are not both closed at the same time (i.e., only one of SW5 and SW6 are closed at any point in time).

Q3 and Q4 implement "current sources" and are connected to a supply voltage node (VDD). Q3 and Q4 are turned on with a bias voltage VB1. The current through Q3 is designated as I3 and the current through Q4 is designated as I4. Q7 and Q8 connect through signal swapper 220 to current terminals of Q3 and Q4, respectively. Q7 and Q8 represent a folded cascode transistor pair and are turned on with a bias voltage VB2. Q5 and Q6 are a matched pair of transistors and couple through signal swapper 230 to Q7 and Q8. Q7 and Q8 are a substantially matched transistor pair and implement a current mirror. As such, the current I7 through Q5 is mirrored in Q6 as current I8. Signal swapper 210 couples to the drains of Q1 and Q2 and to nodes 219 and 221 as shown. Node 219 is the source of Q7 (between Q7 and signal swapper 220) and node 221 is the source of Q8 (between Q8 and signal swapper 220).

Figure 5:
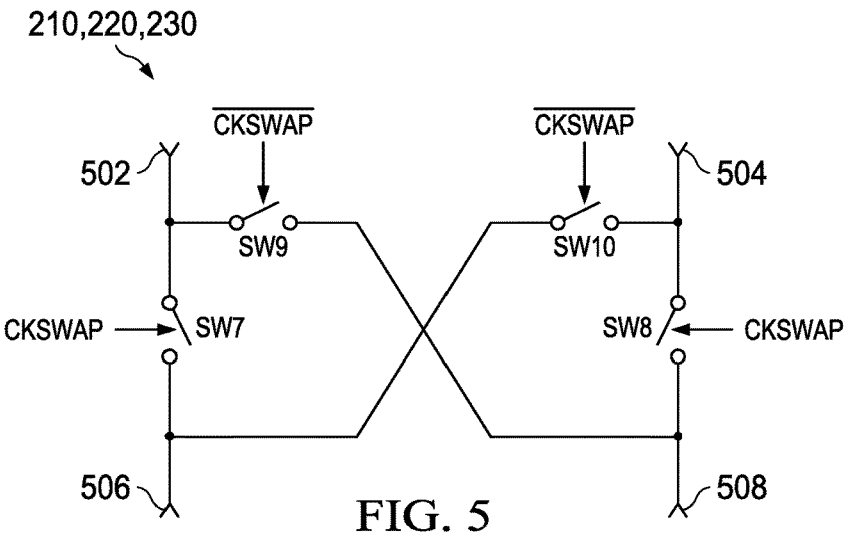
FIG. 5 shows an implementation of a signal swapper usable in the example circuit of FIG. 3.

FIG. 5 illustrates an example of signal swappers 210, 220, and 230. IN this example, the signal swapper includes four switches labeled as SW7, SW8, SW9, and SW10. The signal swapper has 4 terminals 502, 504, 506, and 508. The switches selectively connect terminal 502 to one of terminal 506 and 508, and terminal 504 to other of terminal 506 and 508. In one control state, the outer set of switches SW7 and SW8 are closed (and the cross switches SW9 and SW10 are open). In another control state, the inner set of switches SW9 and SW10 are closed (and the outer switches SW7 and SW8 are open). As such, terminals 502 and 504 are electrically coupled to terminals 506 and 508, respectively, or terminals 502 and 504 are electrically coupled to terminals 508 and 506, respectively.

The operation of the circuit in FIG. 3 will now be explained. For ease of explanation, assume that Q1 and Q2 have relatively large transconductances and threshold voltages equal to 0 V. When CKSWAP is high, SW6 is closed. Further, for the first half of the cycle in which CSWAP Is high (CKR1 is high), the gate voltage on Q1 is the positive portion of VSENSE and for the second half of the cycle (CKR1 is low), the gate on Q1 is VCOM. During this entire cycle, CKR2 is low and thus VCOM is provided to the gate of Q2. As such, the current I1 through Q1 and the current I2 through Q2 are on average:

$$I1 = \frac{VSENSE\_AMP/\pi + VCOM}{R1 + R2}$$

$$I2 = \frac{VCOM}{R3}$$

Assume that signal swappers 220 and 230 are configured so that current I3 passes through to Q7, current I4 passes through to Q8, the current through Q7 (I5) passes through to Q5 as current I7, and that portion of current I6 that does not flow to the filter 250 as I9 flows through Q6 as current I8. In this configuration, the current through Q7 (I5) is the difference between I3 and I2 (i.e., I5=I3−I2). Similarly, the current through Q8 (I6) is the difference between I4 and I1 (i.e., I6=I4−I1). Because Q3 and Q4 are a substantially matched pair of transistors, I3 and I4 should be approximately equal. Current I7 should equal current I8 due to the current mirror formed by Q5 and Q6.

The current I9 flowing into the filter 250 is the difference between I6 and I8 (i.e., I9=I6−I8). Because I6=I4−I1 and I8 equals I7 which also equals I5, I9=(I4−I1)−(I3−I2). As noted above, I3 equals I4, and thus I9=I2−I1. In this example, the filter 250 is a switched capacitor filter that includes an integrator 252 and a sample-and-hold circuit 254. The integrator 252 integrates current I9 which represents the difference between I2 and I1. The sample-and-hold circuit 254 samples the output of the integrator upon assertion of a clock edge (e.g., positive going edge) of CKSWAP.

In steady state operation, meaning that the amplitude of VSENSE is not changing, I2 will equal I1. As such, $$\frac{\left(\frac{VSENSE\_AMP}{\pi} + VCOM\right)}{R1 + R2} = \frac{VCOM}{R3}$$

Assuming R1=R3, then $$VSENSE\_AMP = \pi \frac{R1}{R2} VCOM$$

in steady state operation. However, if the magnitude (or average) of VSENSE increases (e.g., due to the injection of flicker noise into VSENSE), then I1 will be larger or smaller than I2 and thus I9 will change. I9 will increase if I1 falls below I2, or increase if I1 increases above I2. The change in current I9 causes the output of the integrator 252 to change and thus AMP_CTL from the sample-and-hold circuit 254 also will change. In this example, AMP_CTL will increase if I1 is less than I2 and AMP_CTL will decrease if I1 is greater than I2.

The operation of the circuit when CKSWAP is low is similar that described above except that the roles of transistors pairs Q1/Q2, Q3/Q4, and Q5/Q6 as well for resistor pairs R1/R3 and R2/R4 are swapped due to the switches in the signal swappers 210, 220, and 230 changing states as a result of the change in state of CKSWAP. Integration of current I9 over two cycles of VSENSE, where in one period CKSWAP is high and in the other period CKSWAP is low, such that role of transistors pairs Q1/Q2, Q3/Q4, and Q5/Q6 as well for resistor pairs R1/R3 and R2/R4 are swapped substantially reduces errors due to flicker noise, static and dynamic mismatches between the electrical parameters of any of these component pairs.

FIG. 6 illustrates a use of the swapping-based amplitude control circuit 100. In this example, an LC tank circuit formed by an inductor LSENSE and a capacitor CSENSE is driven by a driver 600. A bridge 602 in the driver 600 comprises multiple transistors that connect to current sources 610 and 620. The bridge causes current to flow to the LC tank circuit. The swapping-based amplitude control circuit 100 receives VSENSE from the node interconnecting LSENSE to CSENSE and asserts AMP_CTL as explained above. AMP_CTL is used to control the level of current produced by the current sources 610, 620 flowing to the bridge and thus to the LC tank circuit. If VSENSE begins to increase, the swapping-based amplitude control circuit 100 responds by decreasing AMP_CTL to thereby cause a decrease in current from current sources 610, 620 to thereby cause VSENSE to be reduced. If, however, VSENSE begins to decrease, the swapping-based amplitude control circuit 100 responds by increasing AMP_CTL to thereby cause an increase in current from current sources 610, 620 to thereby cause VSENSE to be increased.

As described herein, the swapping-based amplitude control circuit 100 generates an amplitude control signal AMP_CTL that causes the amplitude of an oscillation signal to remain relatively constant. The swapping-based amplitude control circuit 100 employs signal swapping eliminate errors due to manufacturing tolerances (e.g., Q1 not matching Q2 due to manufacturing tolerances), stress (pressure), temperature gradients, and flicker noise.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit, comprising:
a first transistor including a first control input, a first current terminal, and a second current terminal;
a second transistor including a second control input, a third current terminal, and a fourth current terminal;
a first signal swapper including a first terminal to couple to a first current source, a second terminal to couple to a second current source, a third terminal to couple to the first current terminal of the first transistor, and a fourth terminal to couple to the third current terminal of the second transistor, wherein the first signal swapper selectively electrically couples the first and second terminals to the third and fourth terminals responsive to a first control signal derived from an input oscillation signal;
first and second switches to couple to the first control input of the first transistor, the first switch coupled to receive the input oscillation signal and the second switch coupled to receive a first reference voltage;
third and fourth switches to couple to the second control input of the second transistor, the third switch coupled to receive the input oscillation signal and the fourth switch coupled to receive the first reference voltage;
a second signal swapper coupled to the first signal swapper, to the first current terminal of the first transistor and to the third current terminal of the second transistor;
a first resistor coupled to the second current terminal of the first transistor;
a second resistor coupled in series with the first resistor;
a fifth switch coupled in parallel with the second resistor;
a third resistor coupled to the fourth current terminal of the second transistor;
a fourth resistor coupled in series with the third resistor; and
a sixth switch coupled in parallel with the fourth resistor.

2. The circuit of claim 1, wherein:
the first signal swapper, the second signal swapper, the fifth switch, and the sixth switch are coupled to receive a first control signal derived from the input oscillation signal;
the first and second switches are coupled to receive a second control signal derived from the input oscillation signal and the first control signal, wherein the second control signal is logic high for half of every other cycle of the input oscillation signal and logic low otherwise; and
the third and fourth switches are coupled to receive a third control signal that is derived from the input oscillation signal and the first control signal, wherein the third control is logic low when the second control signal is logic high and the third control signal is logic high for half of the input oscillation signal cycles in which the second control signal is not high.

3. The circuit of claim 2, wherein only one of the fifth switch and the sixth switch are closed at the same time.

4. A circuit, comprising:
a first transistor including a first control input, a first current terminal, and a second current terminal;
a second transistor including a second control input, a third current terminal, and a fourth current terminal;
a first signal swapper including a first terminal to couple to a first current source, a second terminal to couple to a second current source, a third terminal to couple to the first current terminal of the first transistor, and a fourth terminal to couple to the third current terminal of the second transistor, wherein the first signal swapper selectively electrically couples the first and second terminals to the third and fourth terminals responsive to a first control signal derived from an input oscillation signal;
first and second switches to couple to the first control input of the first transistor, the first switch coupled to receive the input oscillation signal and the second switch coupled to receive a first reference voltage;
third and fourth switches to couple to the second control input of the second transistor, the third switch coupled to receive the input oscillation signal and the fourth switch coupled to receive the first reference voltage;
a second signal swapper coupled to the first signal swapper, to the first current terminal of the first transistor and to the third current terminal of the second transistor;
a filter coupled to a third node between the first signal swapper and the second signal swapper, wherein a current from the third node to the filter has a magnitude that proportional to a difference between a current through the first transistor and a current through the second transistor.

5. The circuit of claim 4, wherein the filter generates an amplitude control signal based on the current from the third node.

6. The circuit of claim 4, wherein:
the filter includes an integrator coupled to a sample and hold circuit;
the sample and hold circuit is coupled to receive a first control signal derived from the input oscillation signal to cause the sample and hold circuit to sample and hold an output signal from the integrator as an amplitude control signal; and
the first signal swapper comprises a first plurality of switches and the second signal swapper comprises a second plurality of switches, and wherein half of the first plurality of switches and half of the second plurality of switches are configured to close with the first control signal at a logic high, and a remainder of the first and second plurality of switches are configured to close with the first control signal at a logic low.

7. A circuit, comprising:
a first rectifier coupled to rectify an input oscillation signal as a first rectified output signal;
a second rectifier coupled to rectify the input oscillation signal as a second rectified output signal;
a first analog multiplexer having a first output and configured to select, responsive to a first control signal derived from an input oscillation signal, as the first output the first rectified output signal or a reference signal;
a second analog multiplexer having a second output and configured to select, responsive to the first control signal, as the second output the other one of the second rectified output signal or the reference signal not selected by first analog multiplexer;
a first selectable gain amplifier coupled to the first analog multiplexer and configured, responsive to the first control signal, to select between a first gain or a second gain for application to the first output from the first analog multiplexer;

a second selectable gain amplifier coupled to the second analog multiplexer and configured, responsive to the first control signal, to select between the other of the first gain or the second gain not selected by the first selectable gain amplifier, for application to the second output from the second analog multiplexer; and a signal swapper coupled to the first and second selectable gain amplifiers and including a first signal swapper output and a second signal swapper output, wherein the signal swapper is configured to select, responsive to the first control signal, as the first signal swapper output a signal from one of the first and second gain amplifiers and as the second signal swapper output the other signal from the first and second gain amplifiers.

8. The circuit of claim 7, further comprising a filter to integrate a difference between the first and second signal swapper outputs to produce an integrated output.

9. The circuit of claim 8, further comprising a summer to generate signal indicative of the difference between the first and second signal swapper outputs.

10. The circuit of claim 8, wherein the filter includes a sample and hold circuit to sample hold the integrated output responsive to the first control signal.

11. The circuit of claim 10, further comprising a driver circuit for an LC tank circuit, the driver circuit to generate and oscillation signal whose amplitude is adjustable based on an output signal from the sample and hold circuit.

12. The circuit of claim 7, wherein:
the first selectable gain amplifier includes a first transistor, a first switch, and a first resistor coupled in series with a second resistor, wherein the first switch is coupled in parallel across the second resistor; and
the selectable gain amplifier includes a second transistor, a second switch, and a third resistor coupled in series with a fourth resistor, wherein the second switch is coupled in parallel across the fourth resistor.

13. The circuit of claim 12, wherein the signal swapper includes a first terminal, a second terminal, a third terminal, and a fourth terminal, and wherein:
the first terminal is coupled to receive current from a first current source;
the second terminal is coupled to receive current from a second current source;
the third terminal is coupled to a current terminal of the first transistor;
the fourth terminal is coupled to a current terminal of the second transistor;
the first terminal is configured to be selectably coupled to one of the third terminal or the fourth terminal responsive to the first control signal; and
the second terminal is configured to be selectably coupled to the other of the third terminal or the fourth terminal.

14. A circuit, comprising:
a first transistor including a first control input, a first current terminal, and a second current terminal;
a second transistor including a second control input, a third current terminal, and a fourth current terminal;
a first signal swapper including a first terminal to couple to a first current source terminal, a second terminal to couple to a second current source terminal, a third terminal to couple to the first current terminal of the first transistor, and a fourth terminal to couple to the third current terminal of the second transistor, wherein the first signal swapper selectively electrically couples the first and second terminals to the third and fourth terminals responsive to a first control signal derived from an input oscillation signal;
a first rectifier and a first analog multiplexer to rectify the input oscillation signal to produce a first rectified signal and to select between the first rectified signal and a first reference voltage;
a second rectifier and a second analog multiplexer to rectify the input oscillation signal to produce a second rectified signal and to select between the second rectified signal and the first reference voltage; and
a second signal swapper coupled to the first transistor, the second transistor, and the first signal swapper, the second signal swapper to selectively couple the first transistor to one of the first and second current source terminals and to couple the second transistor to the other of the first and second current source terminals.

15. The circuit of claim 14, further comprising:
a current mirror comprising a third transistor and a fourth transistor; and
a third signal swapper coupled between the first signal swapper and the current mirror, the third signal swapper configured to, responsive to the first control signal, couple the third transistor to one of the first or second transistors and coupled the fourth transistor to the other of the first or second transistors.

16. The circuit of claim 14, wherein:
the first rectifier and the first analog multiplexer collectively include a first switch coupled to receive the input oscillation signal and a second switch coupled to receive the first reference voltage, the first and second switches connected together and to a control terminal of the first transistor; and
the second rectifier and the second analog multiplexer collectively include a third switch coupled to receive the input oscillation signal and a fourth switch coupled to receive the first reference voltage, the first and second switches connected together and to a control terminal of the second transistor.

17. The circuit of claim 15, further comprising an integrator coupled to a terminal of the current mirror and configured to integrate a current that is a difference between a first current that flows through the first transistor and a second current that flows through the second transistor.

* * * * *